United States Patent
Kim et al.

(10) Patent No.: US 7,220,994 B2
(45) Date of Patent: May 22, 2007

(54) IN PLANE SWITCHING MODE LIQUID CRYSTAL DISPLAY DEVICE

(75) Inventors: Byeong Koo Kim, Gyeongsangbuk-Do (KR); Yong Min Ha, Gyeongsangbuk-Do (KR); Hun Jeoung, Gyeongsangbuk-Do (KR)

(73) Assignee: LG.Philips LCD Co., Ltd., Youngdungapo-ku, Seoul (KR)

( * ) Notice: Subject to any disclaimer, the term of this patent is extended or adjusted under 35 U.S.C. 154(b) by 0 days.

(21) Appl. No.: 11/325,441

(22) Filed: Jan. 5, 2006

(65) Prior Publication Data

US 2006/0118828 A1    Jun. 8, 2006

Related U.S. Application Data

(62) Division of application No. 10/860,272, filed on Jun. 4, 2004, now Pat. No. 6,998,283.

(30) Foreign Application Priority Data

Jun. 27, 2003   (KR) .................. 10-2003-0042833

(51) Int. Cl.
    *H01L 29/04*   (2006.01)
(52) U.S. Cl. .................. 257/72; 257/211; 257/652; 349/44

(58) Field of Classification Search ................ 257/213, 257/72, 211, 652; 349/44
See application file for complete search history.

(56) References Cited

U.S. PATENT DOCUMENTS

| | | | |
|---|---|---|---|
| 5,208,690 A * | 5/1993 | Hayashi et al. .............. 349/143 |
| 6,319,760 B1 * | 11/2001 | Lee et al. ................... 438/155 |
| 6,485,997 B2 * | 11/2002 | Lee et al. ................... 438/30 |
| 6,522,369 B2 | 2/2003 | Ohta et al. |
| 6,608,658 B1 * | 8/2003 | Tsujimura et al. ............ 438/30 |
| 2002/0036743 A1 | 3/2002 | Youn et al. |

* cited by examiner

*Primary Examiner*—Doug Menz
(74) *Attorney, Agent, or Firm*—McKenna Long & Aldridge LLP

(57) ABSTRACT

A method for fabricating an in-plane switching LCD device includes forming a data line and a light-shielding layer on a substrate, forming a pixel electrode line and an active region with a polycrystalline silicon thin film, forming a first insulating layer on the substrate, forming a gate electrode and a common electrode line on the first insulating layer, forming a second insulating layer on the substrate, forming a first contact hole that exposes at least portions of the data line and the active region, and forming a connection electrode that connects at least portions of the exposed data line and the active region.

14 Claims, 7 Drawing Sheets

IN PLANE SWITCHING MODE LIQUID CRYSTAL DISPLAY DEVICE

This application is a divisional of application Ser. No. 10/860,272, filed Jun. 4, 2004, now U.S. Pat. No. 6,997,283, which claims priority to Korean Patent Application No. 10-2003-042833, filed Jun. 27, 2003, each of which are incorporated by reference for all purposes as if fully set forth herein.

BACKGROUND OF THE INVENTION

1. Field of the Invention

The present invention relates to a liquid crystal display (LCD) device, and more particularly, to an in-plane switching mode LCD device, and a method for fabricating the same.

2. Discussion of the Related Art

Recently, with the increase of the need for displaying information and the demand for using portable information systems, light and thin film type flat panel display (FPD) devices have been actively researched and commercialized, and the conventional cathode ray tube (CRT) devices have been replaced. Among these flat panel display devices, an LCD device is utilized for displaying an image by utilizing an optical anisotropy of a liquid crystal. The LCD device can be installed in a notebook computer, a desktop monitor, or any other display devices because of its excellent resolution, color rendering capability and picture quality.

A method for driving the LCD device includes a twisted nematic (TN) method that drives a liquid crystal molecule on a nematic in a vertical direction to a substrate. However, this method has a problem that a viewing angle is as narrow as 90°. This is due to a refractive anisotropy of the liquid crystal molecule by which the liquid crystal molecule disposed parallel to the substrate is aligned in the vertical direction to the substrate when a voltage is applied to a liquid crystal display panel.

Accordingly, an in-plane switching method has been proposed to improve the viewing angle to more than 170° by driving the liquid crystal molecule in a horizontal direction for the substrate. The in-plane switching method will be explained in more detail.

FIG. 1 is a plane view showing a part of an array substrate for a conventional in-plane switching LCD device, in which only one pixel is shown by way of illustration. In fact, there are N gate lines and M data lines crossing each other, and therefore N×M pixels exist in an actual LCD device.

As shown in FIG. 1, an array substrate 10 includes a gate line 16 and a data line 17 for defining a pixel region by being arranged horizontally and vertically, a thin film transistor 20 formed at the intersection region between the gate line 16 and the data line 17 as a switching device, and a pixel electrode 18 formed at each pixel region.

The thin film transistor 20 includes a gate electrode 21 connected to the gate line 16, a source electrode 22 connected to the data line 17, and a drain electrode 23 connected to the pixel electrode 18. The thin film transistor 20 further includes first and second insulating layers (not shown) for insulating the gate electrode 21, and the source and drain electrodes 22, 23, and an active layer, namely, a channel layer (not shown) for forming a conductive channel between the source electrode 22 and the drain electrode 23 by a gate voltage supplied to the gate electrode 21.

In the pixel region, a common electrode 8 and the pixel electrode 18 for generating an in-plane horizontal electric field are alternately disposed. The common electrode 8 is diverged from a common electrode line 8a disposed parallel to the gate line 16. The pixel electrode 18 is electrically connected to the drain electrode 23, and diverged from a pixel electrode line 18a overlapped with the common electrode line 8a. The common electrode line 8a is formed on the same plane as the gate line 16. The pixel electrode line 18a is formed on the same plane as the data line 17. An insulating layer is interposed between the common electrode line 8a and the pixel electrode line 18a thus to form a storage capacitor.

In the LCD device, an amorphous silicon thin film was mainly utilized as the channel layer of the thin film transistor 20. The amorphous silicon thin film transistor technique was first described by English LeComber et al. in 1979, and commercialized as a 3-inch liquid crystal portable television in 1986. Recently, an amorphous silicon thin film transistor LCD device with a large area of more than 50-inch has been developed.

However, the field effect mobility of the amorphous silicon thin film transistor of about (<1 cm$^2$/Vsec) prevents its use in peripheral circuits that apply signals to the pixel region, because the peripheral circuits operate at more than 1 MHz. Accordingly, the research and development have been actively performed to simultaneously form a switching transistor in the pixel region and peripheral circuits in a driving circuit region together on a glass substrate by utilizing a polycrystalline silicon thin film transistor, which has the field effect mobility greater than that of the amorphous silicon thin film transistor.

The polycrystalline silicon thin film transistor technique has been applied to a small module such as a camcorder etc. since a liquid crystal color television was developed in 1982. Since the polycrystalline silicon thin film transistor has low photosensitivity, high electric field effect and mobility, a driving circuit can be directly fabricated on a substrate.

Increased mobility enhances the operation frequency of the driving circuit that determines the number of driving pixels that can be driven while maintaining an adequate display capability. More specifically, the increased frequency decreases the charging time of a signal applied to a pixel such that distortion of the signal is decreased and picture quality is thereby improved.

Accordingly, the conventional additional process for connecting a driver integrated circuit (IC) and the pixel array is not necessary thus to increase productivity and reliability. In addition, since the polycrystalline silicon thin film has the above-mentioned excellent characteristics, a smaller and excellent thin film transistor can be fabricated.

The polycrystalline silicon thin film generally has the coplanar structure, in which the gate, source and drain electrodes are formed on the same layer on the basis of the active layer. The active layer is mainly positioned at the lowest layer of the substrate.

In the thin film transistor of the coplanar structure, the channel layer is exposed to lower backlight. Therefore, the channel layer is electrically and optically influenced by the backlight, which may cause an off-current, namely, a leakage current to be increased thus to deteriorate characteristics of the device and lower image quality of an LCD panel.

In order to solve the above-mentioned problem, a method has been proposed to additionally dispose a light-shielding layer below the channel layer to shield incident light thereonto. However, the fabrication process becomes complicated because an additional process is required for forming the light-shielding layer.

In addition, the number of photolithography processes are required in the thin film transistor of the coplanar structure utilizing the polycrystalline silicon thin film more than in a staggered structure, thereby increasing fabrication costs.

SUMMARY OF THE INVENTION

Accordingly, the present invention is directed to a device and method for fabricating the same that substantially obviates one or more of the problems due to limitations and disadvantages of the related art.

An object of the present invention is to provide an in-plane switching LCD device and method for fabricating the same capable of simplifying the fabrication process by forming a thin film transistor utilizing an improved coplanar structure.

Another object of the present invention is to provide an in-plane switching LCD device and method for fabricating the same capable of reducing the fabrication costs and improving an image quality by forming a light-shielding layer at the time of forming a data line.

In order to improve the conventional coplanar structure, a buried bus coplanar (BBC) structure where the source/drain line is formed on the lowest layer of the substrate is utilized in the present invention.

Accordingly, a contact hole forming process for an electrical connection between the source/drain electrode and the channel layer and for an electrical connection between the pixel electrode and the drain electrode, can be integrated as one process thus to simplify a photolithography process, thereby reducing the fabrication process and fabrication costs.

The fabrication process can be more simplified by forming a light-shielding layer at the time of forming a data line.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a method for fabricating an in-plane switching LCD device includes forming a data line and a light-shielding layer on a substrate, forming a pixel electrode line and an active region with a polycrystalline silicon thin film, forming a first insulating layer on the substrate, forming a gate electrode and a common electrode line on the first insulating layer, forming a second insulating layer on the substrate, forming a first contact hole that exposes at least portions of the data line and the active region, and forming a connection electrode that connects at least portions of the exposed data line and the active region.

To achieve these and other advantages and in accordance with the purpose of the present invention, as embodied and broadly described herein, there is also provided an in-plane switching LCD device including a first substrate and second substrate facing each other, a gate line and a data line defining a pixel region by being arranged vertically and horizontally on the first substrate, a polycrystalline silicon thin film transistor having a channel region in the pixel region, a common electrode and a pixel electrode in the pixel region generating an in-plane horizontal electric field, a light-shielding layer preventing light from being introduced into the channel region, and a liquid crystal layer between the first and second substrates.

It is to be understood that can be foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
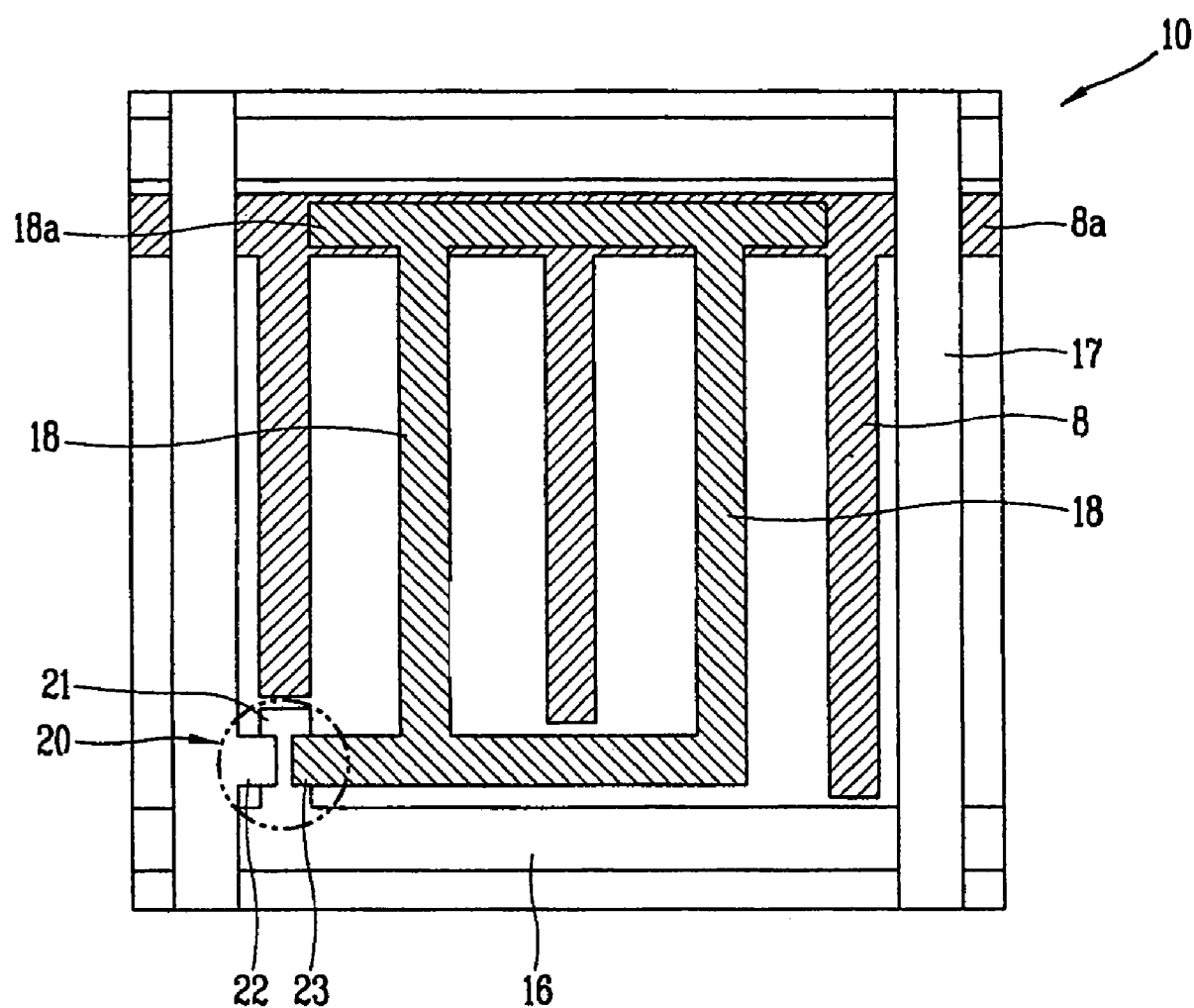
FIG. 1 is a plane view showing a part of an array substrate of a conventional in-plane switching LCD device.
Figure 2A:
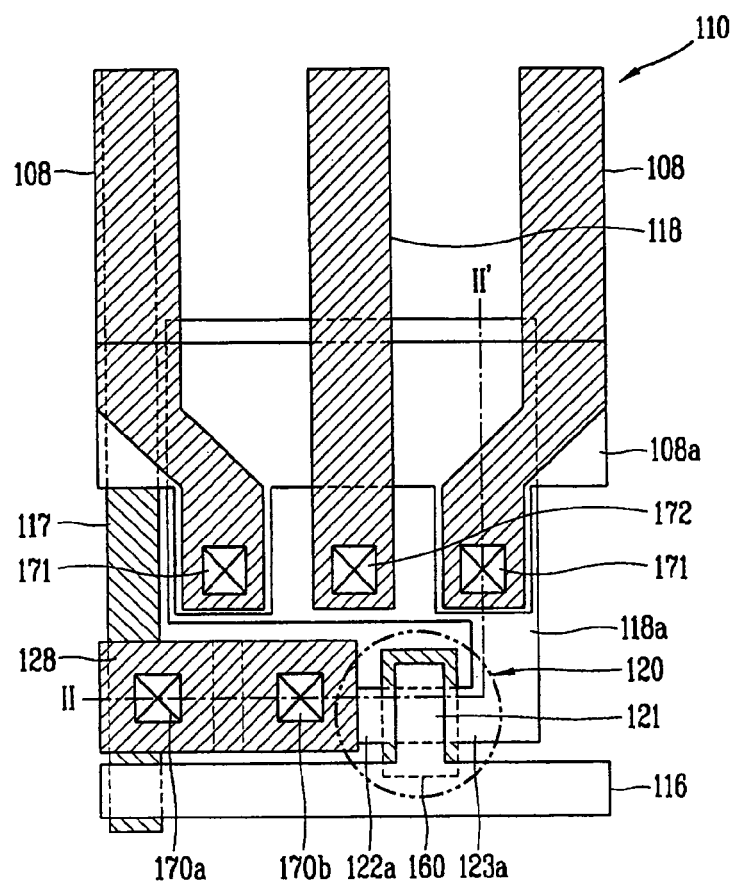
FIG. 2A is a plane view showing a part of an array substrate for an in-plane switching LCD device according to a first embodiment.

FIG. 2A is a plane view showing a part of an array substrate for an in-plane switching LCD device according to a first embodiment of the present invention. In this drawing, only one pixel is shown by way of illustration. In fact, there are N gate lines and M data lines crossing each other, and N×M pixels exist in the actual LCD device.

As shown in FIG. 2A, an array substrate 110 includes a gate line 116 and a data line 117, which are arranged horizontally and vertically on the substrate 110 to define a pixel region and a thin film transistor (TFT) 120. The TFT 120 is formed as a switching device at the intersection region between the gate line 116 and the data line 117.

The thin film transistor 120 includes a gate electrode 121 connected to the gate line 116, a source region 122a connected to the data line 117, and a drain region 123a connected to a pixel electrode 118. The source region 122a is electrically connected to the data line 117 through a connection electrode 128 formed at first contact holes 170a and 170b. Although not shown, the thin film transistor 120 also includes a first insulating layer for insulating the gate electrode 121, the source and drain regions 122a, 123a, and a channel region for forming a conductive channel between the source region 122a and the drain region 123a by a gate voltage supplied to the gate electrode 121.

At least one pair of common electrodes 108 and the pixel electrodes 118 for generating an in-plane horizontal electric field are alternately arranged in the pixel region. The common electrodes 108 are arranged at an outer periphery of the pixel region in order to effectively shield an influence of a signal applied to the data line 117 on the pixel electrode 118.

In the preferred embodiment, the common electrode 108 and the pixel electrode 118 made of a transparent conductive material such as an indium-tin-oxide (ITO) or an indium-zinc-oxide (IZO) are formed at the uppermost layer of the substrate 110.

The common electrode 108 is electrically connected to a common electrode line 108a disposed parallel to the gate line 116 through at least one of second contact holes 171. The pixel electrode 118 is connected to the drain region 123a and is electrically connected to a pixel electrode line 118a overlapped with the common electrode line 108a through at least one of third contact holes 172. The common electrode line 108a is formed on the same plane as the gate line 116. The pixel electrode line 118a is formed on the same plane as the data region 123a. A first insulating layer is interposed between the common electrode line 108a and the pixel electrode line 1118a thus to constitute a storage capacitor.

In the preferred embodiment, the common electrode 108 and the pixel electrode 118 are illustrated as a stripe form. However, the common electrode 108 and the pixel electrode 118 are not limited to the stripe form and may be shaped as a zigzag form. Also, the gate line 116 and the data line 117 may be shaped as a zigzag form to induce a multi-domain where liquid crystal molecules disposed in one pixel are aligned in different directions. That is, light of a different phase due to a birefringence characteristic of the liquid crystal molecule may be attenuated by the multi-domain structure, thereby minimizing a color shift phenomenon.

Herein, a light-shielding layer 160 for preventing light of the lower backlight from being introduced into the channel layer of the thin film transistor 120 is formed below the channel layer.

Figure 2B:
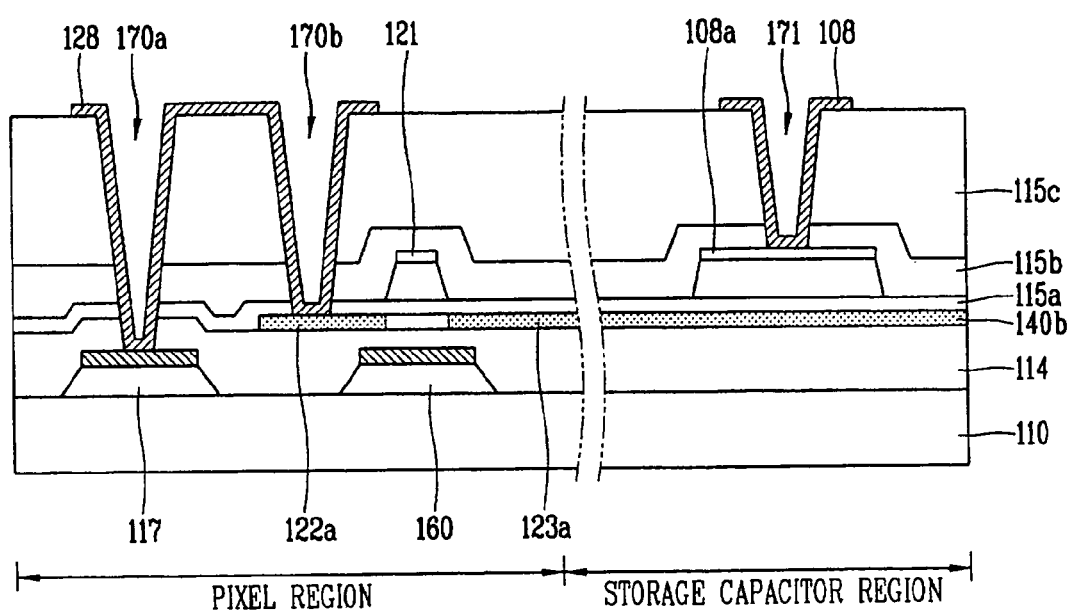
FIG. 2B is a sectional view taken along line II-II of the in-plane switching LCD device of FIG. 2A.

FIG. 2B is a sectional view taken along line II-II of the in-plane switching LCD device of FIG. 2A.

As shown in FIG. 2B, the data line 117 and the light-shielding layer 160 are formed on the array substrate 110. Also, a buffer layer 114, a polycrystalline silicon thin film 140b, and a first insulating layer 115a are sequentially formed on the substrate 110.

The polycrystalline silicon thin film 140b corresponds to a pixel unit. The gate electrode 121, the source region 122a and the drain region 123a constitute a thin film transistor on the polycrystalline silicon thin film 140b. Also, the polycrystalline silicon thin film 140b corresponds to a storage capacitor unit. The common electrode line 108a and the polycrystalline silicon thin film 140b constitute a storage capacitor.

A second insulating layer 115b, and a third insulating layer 115c that is an organic insulating layer, are sequentially deposited on the substrate 110. The second insulating layer 115b and the third insulating layer 115c are formed with the first contact holes 170a, 170b and the second contact hole 171. The data line 117 is electrically connected to the source region 122a through the connection electrode 128 formed at the first contact holes 170a, 170b. The common electrode line 108a is electrically connected to the common electrode 108 through the second contact hole 171.

FIGS. 3A to 3H are exemplary views sequentially showing a fabrication process of the array substrate for the in-plane switching LCD device of FIG. 2A, and showing a method for fabricating an LCD device with a BBC structure utilizing the polycrystalline silicon thin film as the channel layer.

Figure 3A:
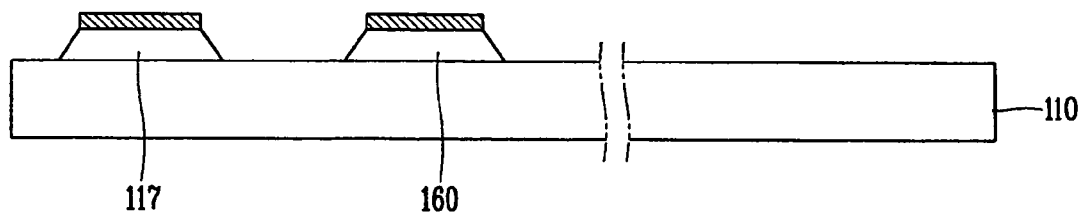
FIGS. 3A to 3H are exemplary views sequentially showing a fabrication process of the array substrate for the in-plane switching LCD device of FIG. 2A.

In FIG. 3A, the data line 117 and the light-shielding layer 160 are formed on the substrate 110, which is made of a transparent insulating material such as glass by a photo process. The light-shielding layer 160, which is made of an opaque metal material, prevents light emitted from the backlight of a lower portion of the LCD panel from being introduced into the channel layer.

If the light-shielding layer 160 and the data line 117 are formed together, an additional photolithography process (hereinafter, a photo process) can be omitted thus to simplify the fabrication process. In addition, if the light-shielding layer 160 is formed of the same material as the data line 117, the fabrication costs can also be reduced.

The light-shielding layer 160 and the data line 117 may be formed of a double conductive layer, including a first layer formed of a low resistance metal material for a fast signal transmission of the LCD device and a second conductive layer formed of a general metal conductive material.

Figure 3B:
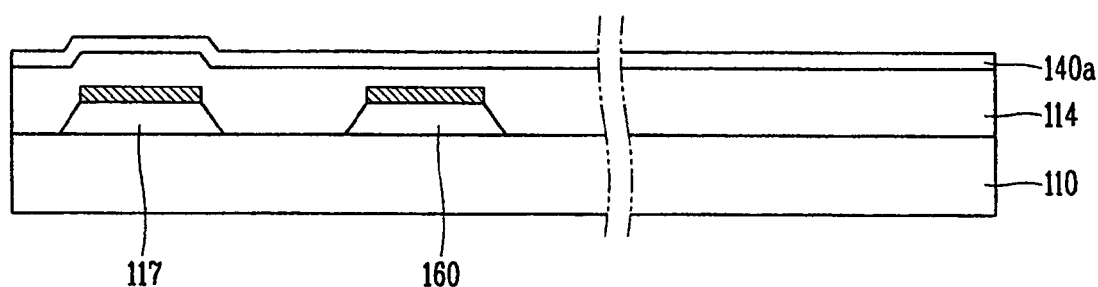

In FIG. 3B, the light-shielding layer 160 and the data line 117 are formed with a predetermined thickness (~5000 Å) on the substrate 110. A buffer layer 114 is deposited on the entire surface of the substrate 110, and then an amorphous silicon thin film 140a is deposited thereon. The buffer layer 114 shields impurity ions such as Na generated from the glass substrate 110 from being introduced into the amorphous silicon thin film 140a at the time of crystallization, and is mainly formed of a silicon oxidation layer $SiO_2$.

The amorphous silicon thin film 140a can be deposited by several methods such as a low pressure chemical vapor deposition (LPCVD), a plasma enhanced chemical vapor deposition (PECVD), etc.

Then, a dehydrogenation process for removing hydrogen existing in the amorphous silicon thin film 140a may be performed at 430° C. for two hours, and after that, a crystallization process is performed. In the preferred embodiment, a laser annealing method is utilized as the crystallization method. However, other crystallization methods having an excellent crystallization characteristic may also be utilized.

Figure 3C:
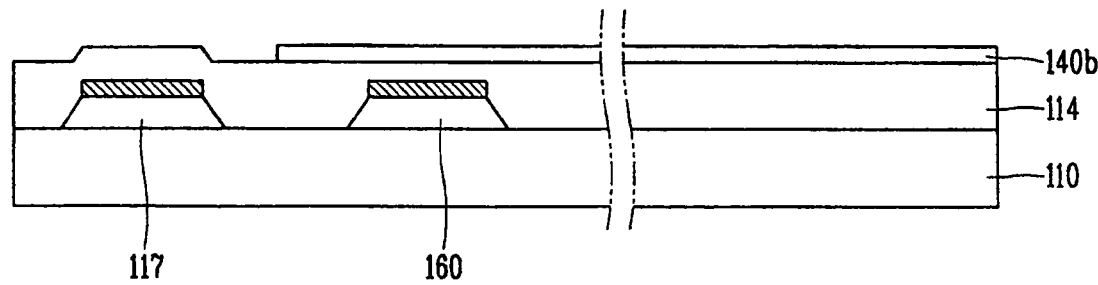

In FIG. 3C, a crystallized silicon thin film 140b is patterned by the photo process.

Figure 3D:
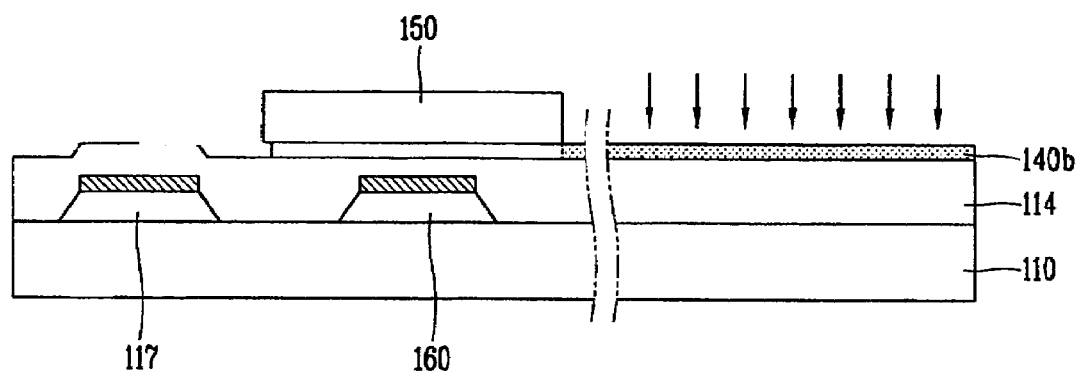

Then in FIG. 3D, a part except a region to be utilized as a storage electrode is shielded by a photoresist 150 thus to inject impurity ions, thereby forming a storage capacitor unit. Even if an P type thin film transistor is formed by utilizing a fifth group impurity in the preferred embodiment, an N type thin film transistor may be formed by utilizing a third group impurity.

Figure 3E:
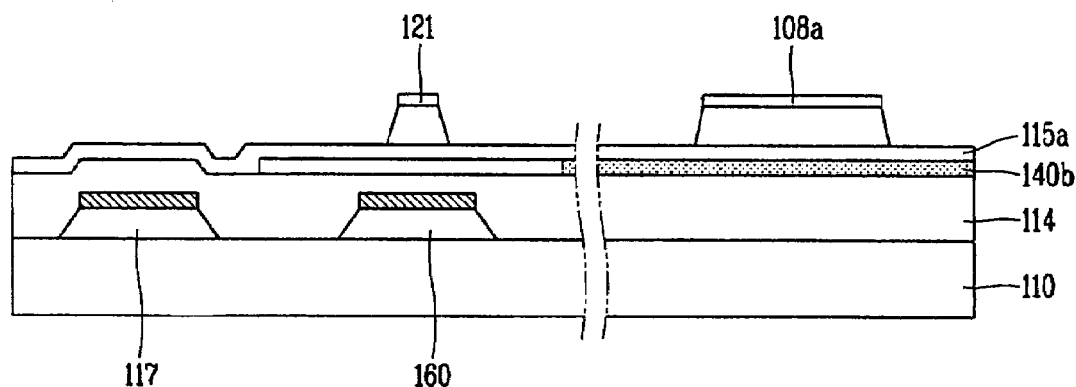

FIG. 3E illustrates a step for forming the gate electrode 121 and the common electrode line 108a. As shown in FIG. 3E, a silicon oxidation layer and a double metal layer of Mo/AlNd may be sequentially deposited by utilizing the first insulating layer 115a, the gate insulating layer. Then, the photo process is performed thus to form the gate electrode 121 and the common electrode 108a that is the storage electrode.

Figure 3F:
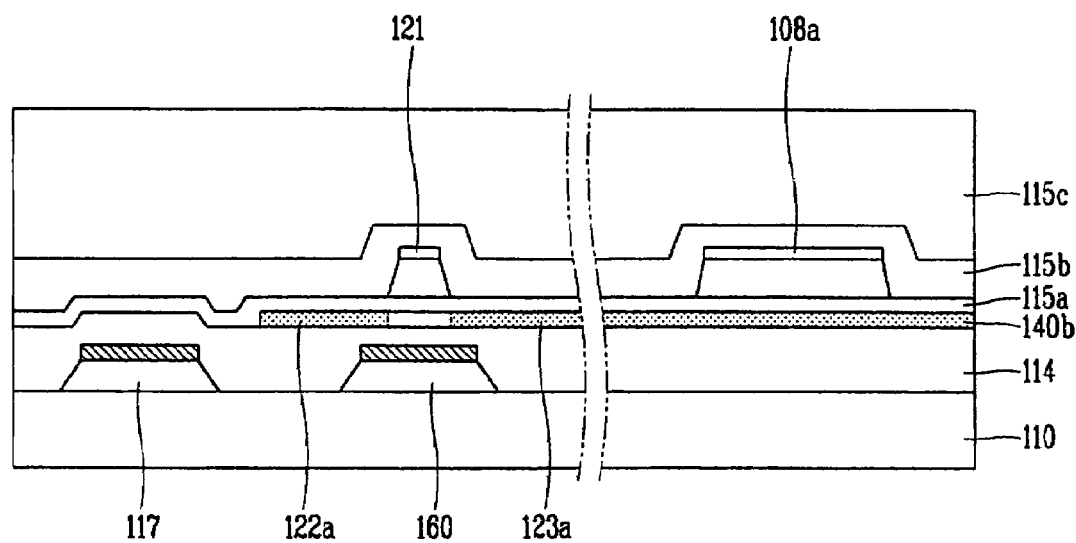

In FIG. 3F, an ion-injection for forming the source region 122a and the drain region 123a is performed by utilizing the gate electrode 121 as a mask. Then, the second insulating layer 115b and the third insulating layer 115c that is an organic insulating layer are sequentially deposited as a passivation layer.

Figure 3G:
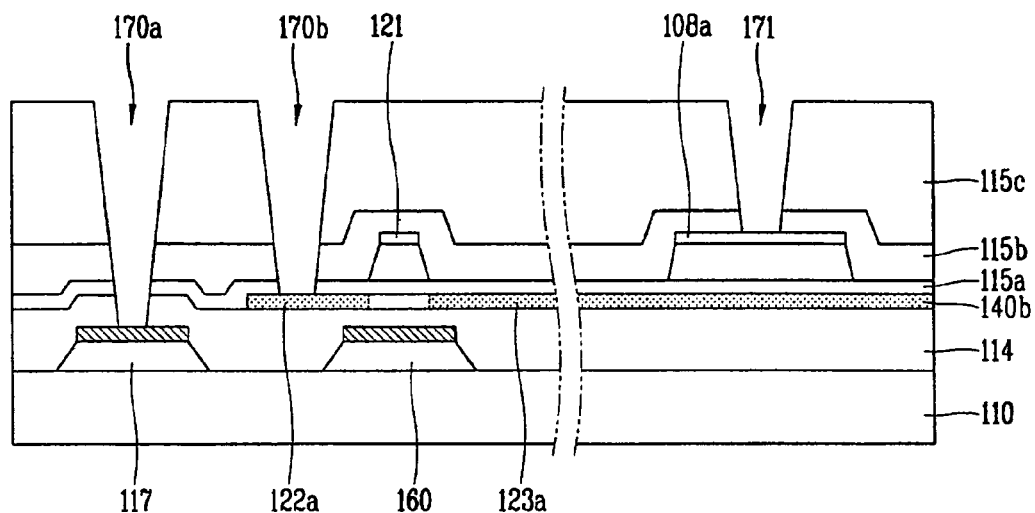

In FIG. 3G, the first contact holes 170a, 170b are formed for electrically connecting the data line 117 and the source region 122a. The second contact hole 171 is formed for electrically connecting the common electrode line 108a and the common electrode 108.

Figure 3H:
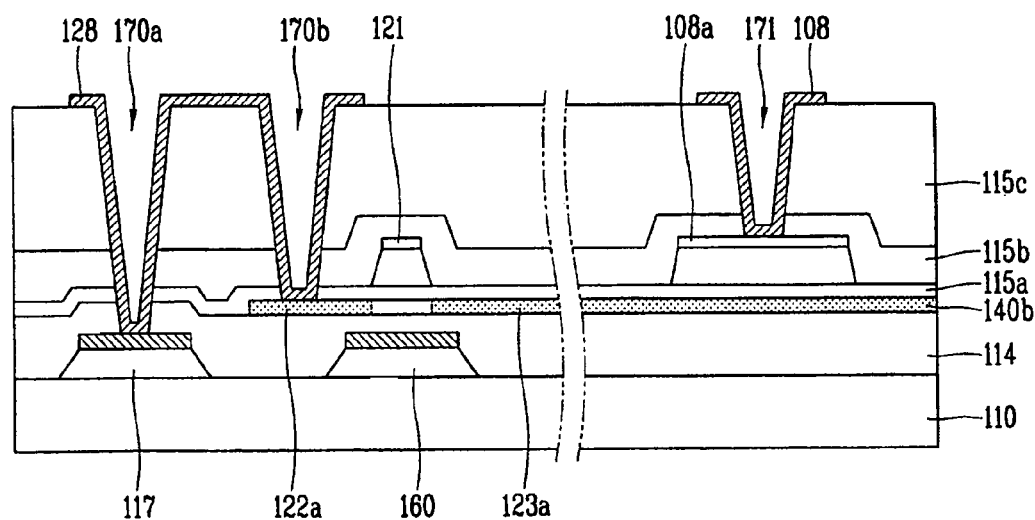

In FIG. 3H, the connection electrode 128 is formed on the third insulating layer 115c through the first contact holes 170a, 170b. The common electrode 108 is formed on the third insulating layer 115c through the second contact hole 171 by utilizing a transparent conductive material such as an indium-tin-oxide, etc.

In the preferred embodiment, a method for fabricating the P type pixel unit thin film transistor is illustrated. An N type thin film transistor may be fabricated by utilizing the same method as the P type thin film transistor except an ion-injection process. In addition, a thin film transistor of a driving circuit unit may be fabricated by utilizing the same method.

In the preferred embodiment, a source/drain line is formed at the lowest layer of the substrate together with the light-shielding layer, thereby simplifying the fabrication process, reducing the fabrication costs, and increasing the image quality.

However, in the above-mentioned preferred embodiment, an additional process is required for forming a contact hole for electrically connecting the common electrode and the common electrode line and for connecting the pixel electrode and the pixel electrode line. This additional process may cause a problem of contact inferiority. The problem is solved by the following preferred embodiment.

Figure 4:
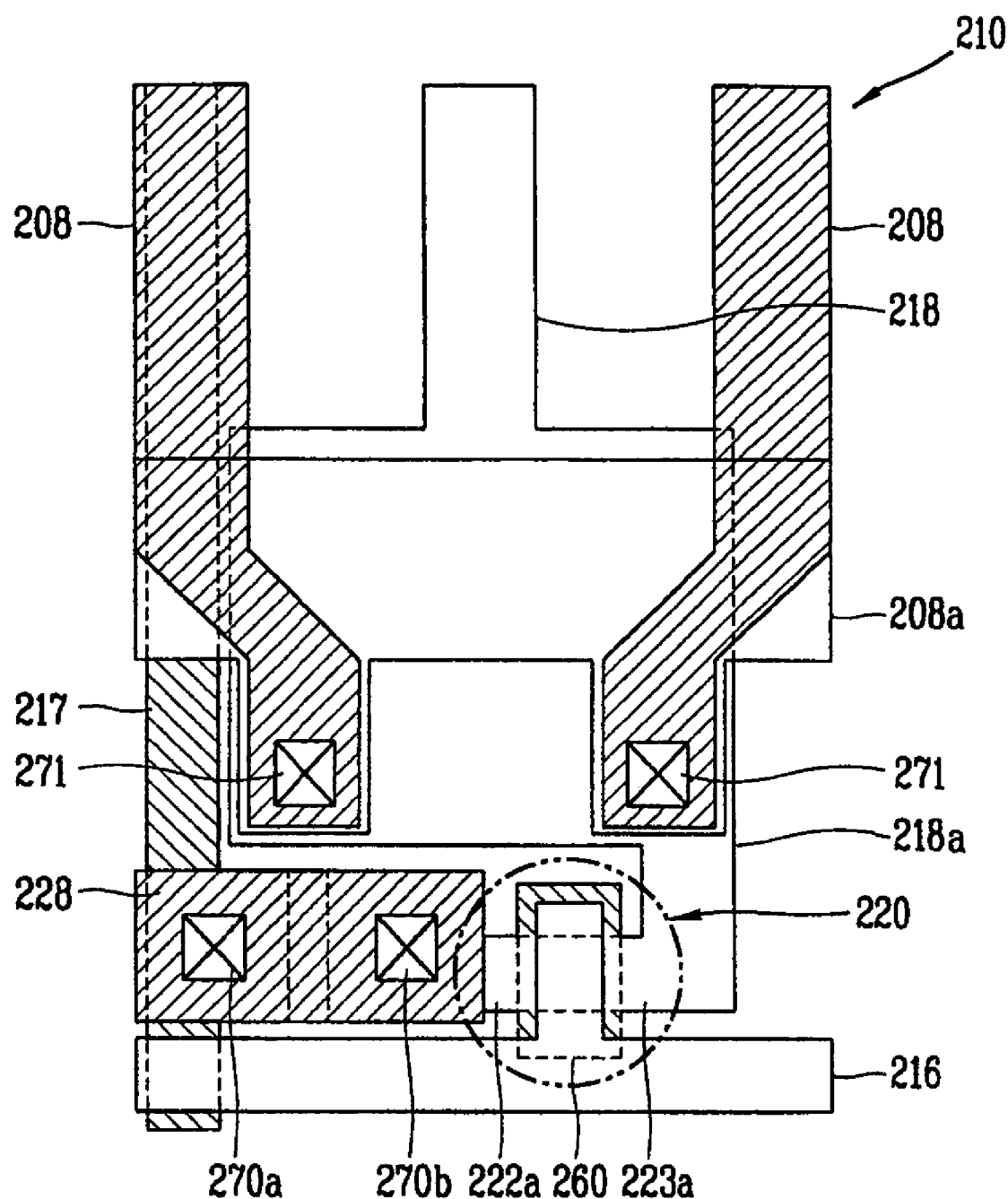
FIG. 4 is a plane view showing a part of an array substrate for an in-plane switching LCD device according to a second embodiment.

FIG. 4 is a plane view showing a part of an array substrate for an in-plane switching LCD device according to a second embodiment, and showing a structure without the third contact hole by forming the pixel electrode with the poly-crystalline silicon thin film.

The in-plane switching LCD device according to the second embodiment has the same construction as that according to the first embodiment of FIG. 2 except the pixel electrode forming method.

As shown in FIG. 4, an array substrate 210 includes a gate line 216 and a data line 217 for defining a pixel region by being arranged vertically and horizontally thereon, and a thin film transistor 220 formed at the intersection region between the gate line 216 and the data line 217 as a switching device.

A light-shielding layer 260 is formed below a channel layer (not shown) of the thin film transistor 220 for preventing light of a lower backlight from being introduced into the channel layer.

At least one pair of common electrodes 208 and pixel electrodes 218 for generating an in-plane horizontal electric field are alternately arranged in the pixel region. The common electrode 208 is electrically connected to a common electrode line 208a disposed parallel to the gate line 216 through at least one of second contact holes 271. The pixel electrode 218 is connected to a drain region 223a, and is formed by extending a pixel electrode line 218a overlapped with the common electrode line 208a.

Unlike the first embodiment, in the second embodiment, the pixel electrode 218 is formed of the same polycrystalline silicon thin film as the pixel electrode line 218a, so that the third contact hole for electrically connecting the pixel electrode 218 with the pixel electrode line 218a is not required. As the result, a contact hole can be reduced by one per one pixel, thereby minimizing the contact inferiority.

The common electrode line 208a is formed on the same plane as the gate line 216, and the pixel electrode line 218a is formed on the same plane as the data region 223a. A first insulating layer is disposed between the common electrode line 208a and the pixel electrode line 218a thus to constitute a storage capacitor.

Figure 5:
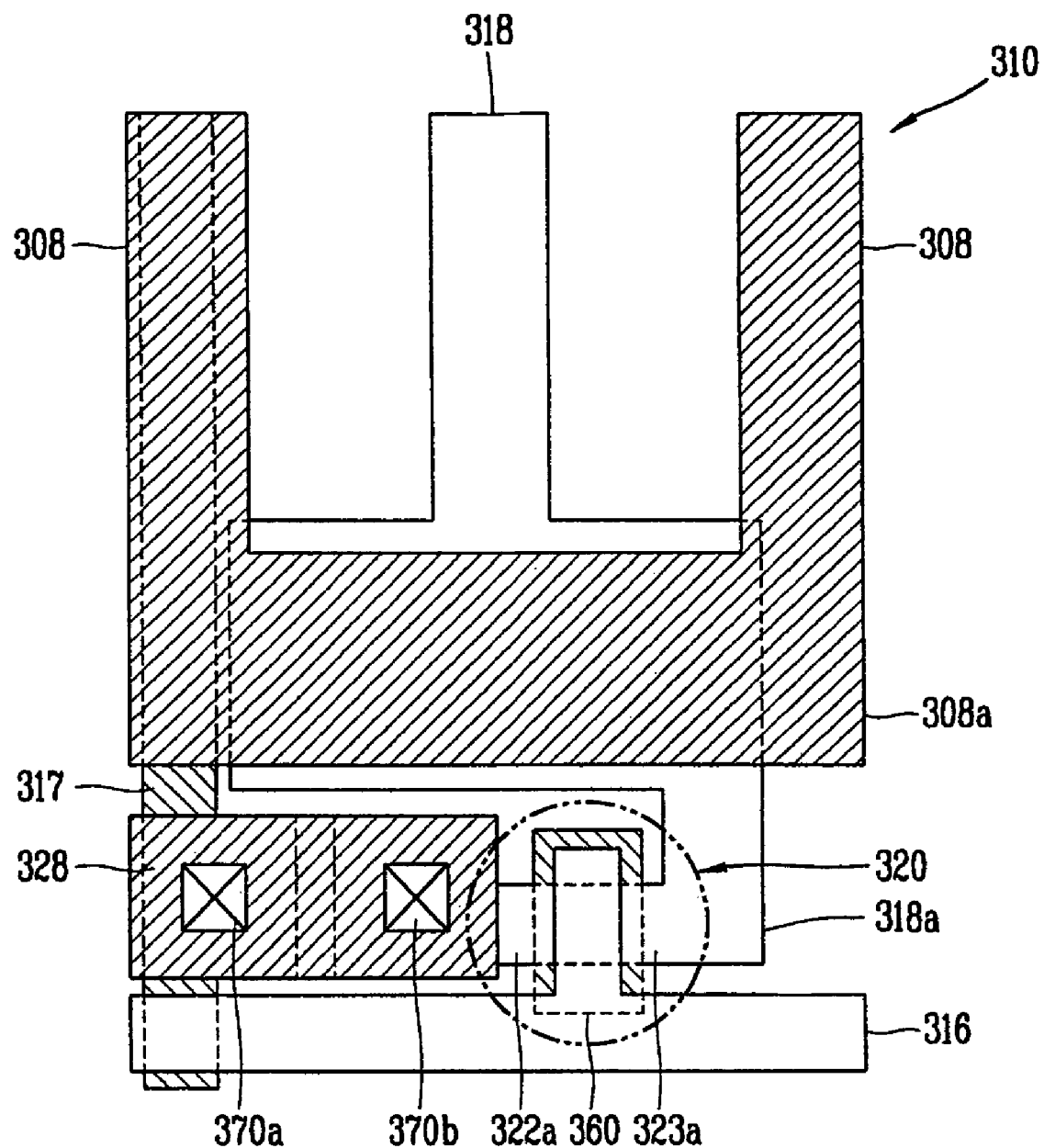
FIG. 5 is a plane view showing a part of an array substrate for an in-plane switching LCD device according to a third embodiment.

FIG. 5 is a plane view showing a part of an array substrate for an in-plane switching LCD device according to a third embodiment.

The in-plane switching LCD device according to the third embodiment has the same construction as that according to the first embodiment of FIGS. 2A, 2B except the method for forming the pixel electrode and common electrode.

Unlike the first embodiment, in the third embodiment, the pixel electrode is formed of the polycrystalline silicon thin film and the common electrode is formed together with the common electrode line, so that the second contact hole and the third contact hole are not required.

As shown in FIG. 5, an array substrate 310 comprises a gate line 316 and a data line 317 for defining a pixel region by being arranged vertically and horizontally thereon, and a thin film transistor 320 formed at the intersection region between the gate line 316 and the data line 317 as a switching device.

A light-shielding layer 360 is formed below a channel layer (not shown) of the thin film transistor 320 for preventing light of a lower backlight from being introduced into the channel layer.

At least one pair of common electrodes 308 and pixel electrodes 318 for generating an in-plane horizontal electric field are alternately arranged in the pixel region. The common electrode 308 is formed by extending a common electrode line 308a disposed parallel to the gate line 316. The pixel electrode 318 is connected to a drain region 323a, and is formed by extending a pixel electrode line 318a overlapped with the common electrode line 308a. That is, unlike the first embodiment, in the third embodiment, the pixel electrode 318 is formed of the same polycrystalline silicon thin film as the pixel electrode line 318a, so that the third contact hole for electrically connecting the pixel electrode 318 with the pixel electrode line 318a, and the second contact hole for electrically connecting the common electrode 308 with the common electrode line 308a are not required. As the result, the contact inferiority problem due to the second contact hole formation and the third contact hole formation is prevented thus to increase a yield and to simplify the fabrication process.

The common electrode line 308a is formed on the same plane as the gate line 316, and the pixel electrode line 318a is formed on the same plane as the data region 323a. A first insulating layer is disposed between the common electrode line 308a and the pixel electrode line 318a thus to constitute a storage capacitor.

It will be apparent to those skilled in the art that various modifications and variation can be made in the present invention without departing from the spirit or scope of the invention. Thus, it is intended that the present invention covers the modifications and variations of this invention provided they come within the scope of the appended claims and their equivalents.

What is claimed is:

1. An in-plane switching LCD device, comprising:
a first substrate and a second substrate facing each other;
a gate line and a data line defining a pixel region by being arranged vertically and horizontally on the first substrate;
a polycrystalline silicon thin film transistor having a channel region in the pixel region;
a common electrode and a pixel electrode in the pixel region generating an in-plane horizontal electric field;
a light-shielding layer positioned on the first substrate and below the channel region, wherein the light shielding layer prevents light from being introduced into the channel region; and
a liquid crystal layer between the first and second substrates.

2. The device of claim 1, wherein one of the common electrode and the pixel electrode is shaped as a zigzag form.

3. The device of claim 1, wherein one of the common electrode and the pixel electrode is formed of an opaque metal.

4. The device of claim 1, wherein one of the common electrode and the pixel electrode is formed of a transparent conductive material.

5. The device of claim 1, further comprising a common electrode line and a pixel electrode line, the common electrode being extended from the common electrode line and the pixel electrode being extended from the pixel electrode line.

6. The device of claim 5, further comprising an insulating layer between the common electrode line and the pixel electrode line.

7. The device of claim 6, wherein the common electrode line and pixel electrode line form a storage capacitor.

8. The device of claim 5, wherein the common electrode connects to the common electrode line via a second contact hole.

9. The device of claim 5, wherein the pixel electrode connect to the pixel electrode line via a third contact hole.

10. The device of claim 1, further comprising a connection electrode connecting a source region of the thin film transistor to the data line via first contact holes.

11. The device of claim 1, wherein at least one of the gate line and data line has a zigzag shape.

12. The device of claim 1, wherein the data line and light shielding layer have a double conductive layer structure.

13. The device of claim 12, wherein a first layer of the double conductive layer structure is a low resistance metal.

14. The device of claim 5, wherein the pixel electrode line and pixel electrode are a same material.

* * * * *